(12) United States Patent
Okada

(10) Patent No.: US 6,633,177 B1
(45) Date of Patent: Oct. 14, 2003

(54) METHOD OF PREDICTING LIFETIME OF SEMICONDUCTOR INTEGRATED CIRCUIT AND METHOD FOR RELIABILITY TESTING OF THE CIRCUIT

(75) Inventor: Kenji Okada, Osaka (JP)

(73) Assignee: Matsushita Electric Industrial Co., LTD (JP)

( * ) Notice: Subject to any disclaimer, the term of this patent is extended or adjusted under 35 U.S.C. 154(b) by 0 days.

(21) Appl. No.: 09/744,260

(22) PCT Filed: Jun. 2, 2000

(86) PCT No.: PCT/JP00/03573

§ 371 (c)(1),
(2), (4) Date: Feb. 1, 2001

(87) PCT Pub. No.: WO00/75980

PCT Pub. Date: Dec. 14, 2000

(30) Foreign Application Priority Data

Jun. 2, 1999 (JP) .......................................... 11-155101

(51) Int. Cl.[7] .............................................. G01R 31/02
(52) U.S. Cl. .................................... 324/765; 324/158.1
(58) Field of Search ................................ 324/452, 456, 324/522, 537, 551, 765, 754, 719, 768, 769, 158.1; 438/14, 17, 18; 361/87

(56) References Cited

U.S. PATENT DOCUMENTS 5,594,349 A * 1/1997 Kimura ........................ 324/551
5,650,336 A    7/1997 Eriguchi et al.

FOREIGN PATENT DOCUMENTS

JP    10-261681    9/1998
JP    11-345850    12/1999

OTHER PUBLICATIONS

Okada et al, "A new prediction method for oxide lifetime and its application to study dielectric breakdown mechanism", 1998 IEEE; 1998 Symposium on VLSI Technology Digest of Technical Papers, p. 158–159.*

Okada et al., "A Concept of Gate Oxide Lifetime Limited by "B–mode" Stress Induced Leakage Currents in Direct Tunneling Regime", Jun. 14–16, 1999, pp. 57–58, 1999 Symposium on VLSI Technology Digest of Technical Papers, 5B–1.

E. Wu et al., "Structural Dependence of Dielectric Breakdown in Ultra–Thin Gate Oxides and Its Relationship to Soft Breakdown Modes and Device Failure", IEEE, Mar. 1998.

T. Sakura et al., "A Detailed Study of Soft–and Pre–Soft–Breakdowns in Small Geometry MOS Structures", IEEE, Mar. 1998.

T. Nigam et al., "Constant Current Charge–to–breakdown: still a valid tool to study the reliability of MOS structures?", IEEE 98CH36173. 36th Annual International Reliability Physics Symposium, Jun. 1998.

K. Okada, "Extended Time Dependent Dielectric Breakdown Model Based on Anomalous Gate Area Dependence of Lifetime in Ultra Thin Silicon Dioxides", Japan J. Appl. Phys., vol. 36, pp. 1443–1447, Part 1, No. 3B, Mar. 1997.

S.H. Lo et al., "Quantum–Mechanical Modeling of Electron Tunneling Current from the Inversion Layer of Ultra–Thin–Oxide nMOSFET's", IEEE Electron Device Letters, vol. 18, No. 5, May 1997.

K. Okada, "The gate oxide lifetime limited by 'B–mode' stress induced leakage current and the scaling limit of silicon dioxides in the direct tunnelling regime", Semicond. Sci. Technol. 15, pp. 478–484, 2000.

International Search Report.

* cited by examiner

*Primary Examiner*—Ernest Karlsen
*Assistant Examiner*—Jimmy Nguyen
(74) *Attorney, Agent, or Firm*—Nixon Peabody LLP; Thomas W. Cole

(57) ABSTRACT

A time it takes for a total leakage current (i.e., a total amount of B-mode stress induced leakage currents) flowing through respective MOS devices in a semiconductor integrated circuit to reach a predetermined reference level is estimated as an expected lifetime of the circuit.

7 Claims, 9 Drawing Sheets

METHOD OF PREDICTING LIFETIME OF SEMICONDUCTOR INTEGRATED CIRCUIT AND METHOD FOR RELIABILITY TESTING OF THE CIRCUIT

TECHNICAL FIELD

The present invention relates to a method for measuring the lifetime of a semiconductor integrated circuit, including MOS devices like MOS transistors, and also relates to a method for reliability testing of the circuit.

BACKGROUND ART

A semiconductor integrated circuit is made up of various types of circuit elements. Among other things, the lifetime of an MOS transistor, one of those types of circuit elements, has an important effect on the reliability of the circuit.

In recent years, as the number of devices integrated in a single semiconductor integrated circuit has been increased, a gate insulating film for an MOS transistor has been thinned considerably. Thus, the degradation of the gate insulating film determines the lifetime of the MOS transistor and eventually has a considerable effect on the lifetime of the circuit itself.

In evaluating the reliability of a semiconductor integrated circuit according to a known technique, an MOS capacitor under test, including a gate insulating film with a relatively wide area, is made in place of multiple small-sized MOS transistors included in the circuit. And the lifetime of the gate insulating film of the capacitor is predicted. That is to say, in the prior art, the reliability of a semiconductor integrated circuit has been evaluated on the supposition that the MOS capacitor including the gate insulating film with a relatively wide area is equivalent to the great number of small-sized MOS transistors.

For example, the lifetime of a semiconductor integrated circuit, made up of one hundred MOS transistors each having an area of 1 $\mu m^2$, has been regarded as equivalent to the lifetime of one MOS capacitor having an area of 100 $\mu m^2$. In other words, the lifetime of the circuit, made up of one hundred MOS transistors each having the area of 1 $\mu m^2$, has been believed a time it takes for a first one of the one hundred MOS transistors to cause a dielectric breakdown (i.e., the amount of leakage current flowing there exceeds its critical value). And the time has been believed equal to the lifetime of the MOS capacitor with the area of 100 $\mu m^2$, or a time it takes for the MOS capacitor to cause a dielectric breakdown.

Specifically, in an MOS transistor including a gate insulating film with a thickness of more than about 4 nm, a steep rise in leakage current, resulting from a stress placed on the transistor, i.e., the generation of hard breakdown (HBD), is identifiable. A gate insulating film with that thickness will be herein called a "thick gate insulating film". In this case, a time it takes for one of multiple MOS transistors in a semiconductor integrated circuit to cause the HBD may be estimated by using an MOS capacitor under test. And the estimated time may be regarded as the circuit's lifetime.

However, as for an MOS transistor including a gate insulating film with a thickness of about 4 nm or less, i.e., a gate insulating film in which a direct tunneling current is prevailing, it is hard to identify the generation of the HBD. A gate insulating film with that thickness will be herein called a "thin gate insulating film".

That is to say, the thinner the gate insulating film of an MOS transistor, the less and less often the obvious dielectric breakdown is observable. Thus, the lifetime of a semiconductor integrated circuit cannot be predicted accurately enough.

DISCLOSURE OF INVENTION

In view of these respects, an object of the present invention is to predict the lifetime of a semiconductor integrated circuit accurately enough even when a thin gate insulating film is used for an MOS device.

To achieve this object, the present inventor carried out various types of researches on the lifetime of a semiconductor integrated circuit. As a result, I made the following findings.

If a stress is continuously placed on an MOS transistor including a gate insulating film with a thickness of about 6 nm or less, the generation of a soft breakdown (SBD) is identifiable. According to the accepted standards, the SBD refers to a state where the dielectric breakdown has not occurred yet. However, a very small amount of leakage current flows through a gate insulating film in the SBD state. Specifically, the SBD herein means a phenomenon that the density of leakage current, flowing locally through a particular region of the gate insulating film, has increased 100 times or more compared to the density before the stress is placed and is now greater than the density of leakage current flowing through any other region. As for an MOS transistor including a gate insulating film with a thickness of more than about 6 nm, it is difficult to identify the generation of the SBD separately from the HBD. This is because when the conditions of SBD generation are met by the transistor, the HBD and SBD much more likely occur at a time in that transistor.

Hereinafter, the SBD will be described with reference to FIG. 1.

FIG. 1 is a graph illustrating variations of gate current-gate voltage ($I_G$–$V_G$) characteristics obtained by repeatedly applying a constant voltage stress to an MOS capacitor including a gate insulating film with a thickness of 2.4 nm and an area of 0.01 $mm^2$.

As shown in FIG. 1, once the stress voltage is applied, the $I_G$–$V_G$ characteristic changes from its initial state initial where the direct tunneling current is prevailing into a B-SILC state. In the B-SILC state, a B-mode stress induced leakage current, resulting from the generation of the SBD, flows through a local region of the gate insulating film. The B-mode stress induced leakage current will be herein called a "B-SILC current".

Also, as the stressing time passes, the B-SILC current increases. Accordingly, the $I_G$–$V_G$ characteristic in the B-SILC state sequentially changes from the curve a into the curve d by way of the curves b and c.

E. Wu et al. reported in IEDM (1998) 187 that where the SBD has occurred in a region of an MOS transistor where the gate electrode overlaps with the source or drain region, the MOS transistor cannot operate anymore. That is to say, E. Wu et al. also regards a time it takes for one of multiple MOS transistors in a semiconductor integrated circuit to cause the SBD as the circuit's lifetime. This approach will be herein called a "first lifetime prediction approach".

Following is the conclusion of my analysis on the "first lifetime prediction approach".

FIG. 2 illustrates relationships between the leakage current $I_G$ and stressing time where a constant voltage stress (CVS) of −4.3 V was applied to two MOS capacitors (which will be herein called "samples A and B") formed on the same semiconductor substrate. It should be noted that "−" herein means that the gate electrode is at the lower potential level. Also, the samples A and B had gate insulating films with the same configuration (i.e., thickness: 2.4 nm; area: 0.01 mm$^2$) and the stress was placed differently on the samples A and B. More specifically, even after the SBD generation had been identified, the stress was continuously imposed on the sample A. As for the sample B on the other hand, the instant the SBD generation was identified, the stressing was once suspended and then the stressing was started again. In FIG. 2, the graph plotted for sample B(1) illustrates a relationship between the leakage current and stressing time before the stressing was suspended. On the other hand, the graph plotted for sample B(2) illustrates a relationship between the leakage current and stressing time after the stressing was restarted.

As shown in FIG. 2, when the SBD occurs, the leakage current $I_G$ of the sample A rises steeply and then increases relatively gently. In contrast, after the stressing is restarted, the leakage current $I_G$ of the sample B (see the graph for the sample B(2)) increases gradually but is smaller than the leakage current $I_G$ of the sample A.

That is to say, the level of the leakage current $I_G$ flowing after the SBD generation changes greatly depending on whether or not the stress is continuously placed after the SBD has occurred. Thus, it can be seen that the amount of B-SILC current flowing after the SBD generation is not determined by the degradation occurred in the gate insulating film before the SBD generation, but by the degradation to occur in the same film after the SBD generation. Examples of the degradation of the former type include creation of defects in the film. And the degradation of the latter type will be herein called an "insulating film degradation".

It is believed that after the SBD has occurred, the insulating film degradation go on because of the following reasons. Specifically, if the charge, stored on the MOS capacitor due to the stress placed, flows through an SBD path being formed, then Jule heat is generated, thereby adversely expanding the SBD path and accelerating the insulating film degradation (see T. Sakura et al., IEDM (1998) 183). The SBD path is a conductive path causing the SBD in the gate insulating film. In this case, the quantity of charge stored on the MOS capacitor changes with the area or thickness of the gate insulating film or the stress voltage. Accordingly, the degree of insulating film degradation occurring after the SBD generation is also greatly dependent on the area or thickness of the gate insulating film or the stress voltage.

As described above, the data shown in FIG. 2 was obtained by applying the stress voltage with the absolute value of 4.3 V to the MOS capacitor including the gate insulating film with the area of 0.01 mm$^2$. On the other hand, each of MOS transistors included in a semiconductor integrated circuit that should have its lifetime predicted (which will be herein called a "actual device") has a gate insulating film with an area of about 1 μm$^2$, for example. Also, a gate voltage applied to each MOS transistor under its actual operating conditions is about 1.5 V, for example. Accordingly, in the experiment carried out to obtain the data shown in FIG. 2, leakage current, corresponding to a charge quantity about 30,000 times as large as that of the actual device, flowed along the SBD path. However, the size of the SBD path being formed is not dependent on the area of the insulating film. Thus, even if the SBD has occurred at just one of the MOS transistors in the actual device, the amount of B-SILC current flowing through the gate insulating film would be too small to affect the operation of the transistor.

Next, a method of measuring the B-SILC current with a constant current stress (CCS) applied will be described with reference to the flowchart illustrated in FIG. 3.

In Step S1, stress current supplied to a sample like an MOS transistor, time interval at which it is determined whether the SBD occurred or not, and threshold value of voltage variation by which the SBD generation is identified are set to $I_{stress}$ [A], t [s] and r [%], respectively. The threshold value will be herein called a "variation threshold value".

In Step S2, the stress current of $I_{stress}$ [A] starts to be supplied to the sample. Next, in Step S3, the magnitude of a stress voltage (i.e., a first voltage value $V_1$) needed to supply the stress current of $I_{stress}$ [A] is measured. Then, in Step S4, the stress current of $I_{stress}$ [A] is continuously supplied for t seconds. Thereafter, in Step S5, the magnitude of a stress voltage (i.e., a second voltage value $V_2$) needed to supply the stress current of $I_{stress}$ [A] is measured.

In Step S6, it is determined whether or not a ratio of the absolute value of the voltage variation $V_2-V_1$ between the second and first voltage values $V_2$ and $V_1$ to the first voltage value $V_1$ has become equal to or greater than r %.

If the ratio of the absolute value of the voltage variation $V_2-V_1$ to the first voltage value $V_1$ is less than r % (i.e., where the SBD has not occurred yet), then the first voltage value $V_1$ is updated into the second voltage value $V_2$ in Step S7. Then, the process returns to Step S4.

Alternatively, if the ratio of the absolute value of the voltage variation $V_2-V_1$ to the first voltage value $V_1$ is r % or more (i.e., where the SBD has already occurred), then the stressing is suspended in Step S8. Thereafter, in Step S9, the total stressing time that has passed since the start of stressing is obtained as an SBD generation time (i.e., a time that has passed since the start of stressing and until the SBD generation) $T_{SB}$. Then, in Step S10, the amount of leakage current flowing when a predetermined gate voltage is applied to the sample, i.e., the amount of B-SILC current $I_{BSILC}$, is measured.

In the method of measuring the amount of B-SILC current as shown in FIG. 3, if the time interval of t [s] is shortened, then the stressing can be suspended almost simultaneously with the SBD generation. Thus, the insulating film degradation after the SBD generation can be suppressed to a certain degree as described above.

FIG. 4 is a graph illustrating a correlation between the amount of B-SILC current $I_{BSILC}$, which was obtained by the B-SILC current measuring method shown in FIG. 3, and the amount of stress current $I_{stress}$. In other words, FIG. 4 illustrates the stress condition dependence of the B-SILC current. The amount of B-SILC current $I_{BSILC}$ shown in FIG. 4 was measured by applying a gate voltage $V_G$ of −1.5 V to an MOS capacitor, including a gate insulating film with a thickness of 2.4 nm and an area of 0.01 mm$^2$, after the SBD had been generated there by supplying various stress currents thereto. Also shown in FIG. 4 is a variation in the amount of B-SILC current $I_{BSILC}$ where the gate voltage $V_G$ of −1.5 V was continuously applied thereto for 100 seconds after the SBD had been generated.

As shown in FIG. 4, a correlation (see the dashed line) exists between the amounts of B-SILC and stress currents $I_{BSILC}$ and $I_{stress}$. Specifically, the amount of B-SILC current $I_{BSILC}$ lightly depends on the amount of stress current $I_{stress}$: the smaller the amount of stress current $I_{stress}$, the smaller the amount of B-SILC current $I_{BSILC}$. However, as also shown in FIG. 4, once the amount of stress current $I_{stress}$ exceeds a certain value, the B-SILC current $I_{BSILC}$ flows in the amount (between −1 μA and −10 μA) greater than those represented by the dashed-line correlation.

FIG. 5 is a graph illustrating variations of $I_G$–$V_G$ characteristics obtained by using the B-SILC current measuring method shown in FIG. 3 with the amount of stress current $I_{stress}$ changed. The $I_G$–$V_G$ characteristics shown in FIG. 5 were obtained by applying various gate voltages $V_G$ to an MOS capacitor, including a gate insulating film with a thickness of 2.4 nm and an area of 0.01 mm², after the SBD had been generated by supplying various stress currents thereto. In FIG. 5, the $I_G$–$V_G$ characteristic for the range where the dashed-line correlation shown in FIG. 4 was met, i.e., the range where the amount of B-SILC current $I_{BSILC}$ for the gate voltage $V_G$ of −1.5 V was smaller than 1 μA (absolute value), is represented by the curve a. The $I_G$–$V_G$ characteristic for the range where the correlation shown in FIG. 4 was not met, i.e., the range where the amount of B-SILC current $I_{BSILC}$ for the voltage $V_G$ of −1.5 V was 1 μA (absolute value) or more, is represented by the curve b or c. And the $I_G$–$V_G$ characteristic before the stress was placed is represented the curve initial.

As for the $I_G$–$V_G$ characteristic represented by the curve a in FIG. 5, the amount of gate current, i.e., the amount of leakage current, is at a negligible level for a transistor to operate properly. On the other hand, as for the $I_G$–$V_G$ characteristic represented by the curve b or c in FIG. 5, the amount of leakage current reaches such a level as making the transistor inoperable. However, the amount of B-SILC current depends on a stress condition (e.g., stress current or stress voltage) as described above. Accordingly, it is believed that the leakage current flowing through an MOS transistor included in an actual device cannot reach the level as represented by the curve b or c in FIG. 5.

As described above, I believe that even if the SBD has occurred at just one of multiple MOS transistors in a semiconductor integrated circuit, the operation of the circuit itself would not be interfered with that. For that reason, if the lifetime of a semiconductor integrated circuit were predicted by the "first lifetime prediction approach", the expected lifetime might be shorter than the actual one. Accordingly, if the thickness of a gate insulating film or a gate voltage for an MOS transistor is adjusted to equalize the lifetime predicted by the "first lifetime prediction approach" with a desired value (e.g., 10 years), the film could be excessively thick or the voltage could be unnecessarily low. As a result, the operating speed of the transistor decreases, thus considerably deteriorating the performance of the circuit.

As described in the "background art", it is difficult to definitely identify the generation of the HBD in an MOS transistor including a thin gate insulating film.

So I supplied a new definition for the "HBD generation". Specifically, I supposed that the lifetime of a semiconductor integrated circuit could be represented by a time it takes for one of multiple MOS transistors in the circuit to cause a newly defined HBD (which will be herein called a "redefined HBD"). This alternative approach will be herein called a "second lifetime prediction approach".

Hereinafter, the conclusion of my analysis on the "second lifetime prediction approach" will be described.

Even if the SBD has occurred in an MOS transistor, the amount of leakage current, i.e., gate current, is so small as represented by the curve d in FIG. 1, for example, that an inversion layer to be a channel for carriers can be formed under the gate insulating film.

However, considering the drain current-gate voltage ($I_D$–$V_G$) characteristic of an MOS transistor, the magnitude of a gate current at an operating voltage of 1.5 V (absolute value) should be equal to or less than a threshold value between several μA and about 10 μA to distinguish the ON/OFF states of the transistor from each other.

Thus, I regard the instant the magnitude of the gate current exceeds the threshold value as the instant the redefined HBD occurs.

FIG. 6 illustrates relationships between the leakage current $I_G$ and stressing time passed after the SBD generation where a constant voltage stress (CVS) of −3.25 V was applied to an MOS capacitor including a gate insulating film with a thickness of 2.4 nm and an area of 0.01 mm² after the SBD had occurred. The leakage currents shown in FIG. 6 were obtained by applying gate voltages $V_G$ of −1.5 V and −0.5 V to the MOS capacitor after the stress started to be placed. The SBD generation may be identified by the B-SILC current measuring method shown in FIG. 3.

As illustrated in FIG. 6, whether the voltage $V_G$ is −1.5 V or −0.5 V, the magnitude of the leakage current $I_G$ is almost constant until the point in time indicated by the dashed line. However, after the point in time indicated by the dashed line, the leakage current $I_G$ goes on increasing. Also, where the gate voltage $V_G$ is −1.5 V, the leakage current $I_G$ changes almost continuously before and after the point in time indicated by the dashed line in FIG. 6. In contrast, where the gate voltage $V_G$ is −0.5 V, the leakage current $I_G$ rises abruptly at the point in time indicated by the dashed line in FIG. 6.

To identify the generation of the redefined HBD, the instant the leakage current $I_G$ for the gate voltage $V_G$ of −1.5 V exceeds the threshold value (i.e., on the order of several μA to 10 μA) should be located. However, as shown in FIG. 6, the threshold level exists in the range where the leakage current $I_G$ goes on increasing continuously. Thus, it is difficult to know exactly when the redefined HBD occurs. For that reason, I regard the point in time the leakage current $I_G$ for the gate voltage $V_G$ of −0.5 V rises steeply as indicated by the dashed line in FIG. 6 as the instant the redefined HBD occurs. And the interval between the SBD generation and the redefined HBD generation (which will be herein called an "HBD generation time $T_{HB}$") is obtained. FIG. 7 illustrates the dependence of the HBD generation time $T_{HB}$ obtained this way on the stress voltage $V_{stress}$ (which will be herein called "stress voltage dependence"). The data shown in FIG. 7 was obtained with the stress voltage $V_{stress}$ applied at a temperature of 25° C. Also illustrated in FIG. 7 is the stress voltage dependence of the SBD generation time $T_{SB}$ obtained by the B-SILC current measuring method shown in FIG. 3, for example.

As shown in FIG. 7, it is clear that the stress voltage dependence of the HBD generation time $T_{HB}$ is different from that of the SBD generation time $T_{SB}$. If the stress voltage $V_{stress}$ is approximately equal to the actual operating voltage (e.g., about −1.5 V), the HBD generation time $T_{HB}$ is greater than the SBD generation time $T_{SB}$ by about five orders of magnitude or more. Accordingly, a time $T_{BD}$ it takes for an MOS capacitor to cause the redefined HBD is the sum of the SBD and HBD generation times $T_{SB}$ and $T_{HB}$ strictly speaking, but can be essentially represented by the HBD generation time $T_{HB}$.

As described above, if the lifetime of a semiconductor integrated circuit is predicted by the "second lifetime prediction approach", then the circuit's lifetime is substantially equal to the HBD generation time $T_{HB}$.

Furthermore, the longer the stressing time, the greater the B-SILC current resulting from the SBD generation and the greater the power dissipated. Thus, it becomes necessary to consider the power dissipated by the B-SILC current as a new factor limiting the lifetime of a semiconductor integrated circuit. In other words, the circuit's lifetime should also be checked from this viewpoint, i.e., whether or not the power dissipated by the B-SILC current has exceeded an allowable value.

Thus, I supposed that the lifetime of a semiconductor integrated circuit could also be represented by a time it takes for a total amount of B-mode stress induced leakage currents, flowing through respective MOS transistors in the circuit, to reach a predetermined reference level. The reference level may be determined by the power dissipation specification of the circuit as a whole. This alternative approach will be herein called a "third lifetime prediction approach".

Hereinafter, the conclusion of my analysis on the "third lifetime prediction approach" will be described.

According to the third lifetime prediction approach, the behaviors of respective MOS transistors in a semiconductor integrated circuit are all taken into account. That is to say, the degradation of the overall circuit changes depending on the number of SBD spots, i.e., spots where the SBD has occurred in the transistors. In the following description, the number of SBD spots will be represented by the number of transistors in each of which just one SBD spot exists (which transistor will be herein called an "SBD transistor") for the sake of simplicity. Actually, a number of SBD spots should exist in a single transistor. Statistically speaking, though, the existence of 100 SBD spots in one transistor is equivalent to the existence of one SBD spot in each of one hundred transistors.

Suppose a number N (which is a natural number) of MOS transistors are included in a semiconductor integrated circuit implemented as a single semiconductor chip. The greater the number of SBD transistors among the number N of MOS transistors, the larger the total amount of B-mode stress induced leakage currents flowing through the circuit (which will be herein called a "total leakage current"). In this case, the magnitude of B-mode stress induced leakage current flowing through one SBD spot (i.e., a single SBD transistor) would be smaller than the amount of reference leakage current required for the circuit in accordance with power dissipation specifications, for example. The amount of reference leakage current will be herein called a "reference level". Accordingly, while the number of SBD transistors is still small, the total leakage current of the circuit is believed to be less than the reference level.

As described above, according to the "third lifetime prediction approach", the life of a semiconductor integrated circuit is supposed to expire when the total leakage current, increasing with the rise in number of SBD transistors, exceeds the reference level. Thus, supposing the number of SBD transistors is M when the total leakage current exceeds the reference level, the circuit's lifetime can be predicted as a time that should pass after the stress started to be placed until the number of SBD transistors reaches M.

The present invention was made based on the above-described findings, or the "third lifetime prediction approach", in particular. Specifically, in a first inventive method of predicting the lifetime of a semiconductor integrated circuit, a time it takes for a total amount of B-mode stress induced leakage currents, flowing through respective MOS devices in the circuit, to reach a predetermined reference level is estimated as an expected lifetime of the circuit.

According to the first inventive lifetime prediction method, the lifetime of a semiconductor integrated circuit can be predicted without identifying the generation of a hard breakdown (HBD) in MOS devices. Thus, even if a thin gate insulating film, for which the HBD generation is nonidentifiable, is used for the MOS devices, the circuit's lifetime can be predicted reliably.

Also, compared to regarding a time it takes for just one of MOS devices in a semiconductor integrated circuit to cause the SBD as the circuit's lifetime (comparative example), the circuit's lifetime, predicted by the first inventive method, can be closer to the actual one. Accordingly, if the thickness of a gate insulating film or a gate voltage for the MOS devices is adjusted to equalize the circuit's lifetime, predicted by the first method, with a desired value, the gate insulating film will not be excessively thick or the gate voltage will not decrease unnecessarily. As a result, the circuit can be downsized and the operating speed of the MOS devices can be increased, thus enhancing the performance of the circuit.

A second inventive method of predicting the lifetime of a semiconductor integrated circuit includes: a first step of deriving, as a unit leakage current level, the amount of a B-mode stress induced leakage current flowing through each of SBD spots where a soft breakdown has occurred in multiple MOS devices included in the circuit; and a second step of obtaining a critical spot number from the unit leakage current level. The critical spot number is a minimum number of SBD spots required for a total amount of B-mode stress induced leakage currents, flowing through the respective MOS devices, to exceed a predetermined reference level. The second method further includes a third step of estimating, as an expected lifetime of the circuit, a time it takes for the number of SBD spots in the MOS devices to reach the critical spot number.

According to the second inventive lifetime prediction method, the first inventive lifetime prediction method is implementable just as intended. Thus, the same effects as those of the first inventive method are attainable without fail.

In the second inventive method, the third step preferably includes the steps of: obtaining a time $T_0$ it takes for an MOS device under test, including a gate insulating film with an area $S_0$, to cause a soft breakdown; and predicting the circuit's lifetime by $$T_{BSILC} = T_0 \times ((M \times S_0)/S_{chip})^{1/m}$$

where $T_{BSILC}$ is the circuit's lifetime, M is the critical spot number, $S_{chip}$ is a total area of the gate insulating films of the MOS devices and m is a form parameter in a Weibull distribution of the time $T_0$.

In such an embodiment, the circuit's lifetime can be predicted accurately.

In the second inventive method, the circuit is preferably virtually made up of a number N (which is a natural number) of MOS devices, each having a gate insulating film with an area $S_{Tr}$. And the third step preferably includes the steps of: obtaining a time $T_{SB(Tr)}$ it takes for an MOS device under test, including a gate insulating film with the area $S_{Tr}$, to cause a soft breakdown; and predicting the circuit's lifetime by $$T_{BSILC} = T_{SB(Tr)} \times (M/N)^{1/m}$$

where $T_{BSILC}$ is the circuit's lifetime, M is the critical spot number and m is a form parameter in a Weibull distribution of the time $T_{SB(Tr)}$.

The circuit's lifetime can also be predicted reliably enough by doing so.

In the second inventive method, the circuit is preferably virtually made up of a number N (which is a natural number) of MOS devices, each having a gate insulating film with an area $S_{Tr}$. And the third step preferably includes the steps of: obtaining a time $T_{SB(Tr)}$ it takes for an MOS device under test, including a gate insulating film with the area $S_{Tr}$, to cause a soft breakdown; and predicting the circuit's lifetime by $$T_{BSILC} = T_{SB(Tr)} \times ((M \times S_{Tr})/S_{chip})^{1/m}$$

where $T_{BSILC}$ is the circuit's lifetime, M is the critical spot number, $S_{chip}$ is a total area of the gate insulating films of the MOS devices and m is a form parameter in a Weibull distribution of the time $T_{SB(Tr)}$.

The circuit's lifetime can also be predicted accurately enough by doing so.

In the second inventive method, the third step preferably includes the steps of: deriving a Weibull function for a time it takes for an MOS device under test to cause a soft breakdown; and predicting the circuit's lifetime using a Weibull plot of the Weibull function.

The circuit's lifetime can also be predicted accurately enough by doing so.

An inventive method for reliability testing of a semiconductor integrated circuit includes: a first step of estimating a first time it takes for a total amount of B-mode stress induced leakage currents, flowing through respective MOS devices in the circuit, to reach a predetermined reference level where an actual operating voltage is applied to the circuit; a second step of estimating a second time it takes for an MOS device under test to cause a soft breakdown from the first time where a test voltage, higher than the actual operating voltage, is applied thereto, and then determining, by the second time, a reference control level for a predetermined control point of the device under test; and a third step of measuring the control point of the device under test where the test voltage is applied thereto, and then determining whether or not a result of the measurement meets the reference control level.

According to the inventive reliability testing method, the reliability of a semiconductor integrated circuit can be tested using a first time it takes for a total amount of B-mode stress induced leakage currents, flowing through respective MOS devices, to reach a predetermined reference level at an actual operating voltage. That is to say, the reliability of the circuit can be tested using the circuit's lifetime predicted by the first inventive lifetime prediction method at the actual operating voltage. Accordingly, even if a thin gate insulating film, for which the HBD generation is non-identifiable, is used for the MOS device, the reliability of the circuit can be tested just as intended.

BEST MODE FOR CARRYING OUT THE INVENTION

First, the basic principle of the inventive method of predicting the lifetime of a semiconductor integrated circuit will be described. In the following example, the principle will be explained as being applied to a situation where the B-SILC currents, resulting from the SBD, have increased at multiple MOS transistors in a semiconductor integrated circuit implemented as a single semiconductor chip.

It should be noted that the inventive lifetime prediction method for a semiconductor integrated circuit was developed by the "third lifetime prediction approach" (see "Disclosure of Invention").

In the following description, suppose the number of MOS transistors included in the circuit is N, a natural number. The magnitude of B-SILC current flowing through one MOS transistor with a single SBD spot (i.e., one SBD transistor) at an actual operating voltage is a unit current amount $I_{BSILC}$. And the maximum amount of off-state leakage current, determined by the power dissipation specification of the overall circuit (i.e., the reference level), is $I_{offspec}$.

If the amount of off-state leakage current flowing through the overall circuit is $I_{off}$ and the number of SBD transistors is M0, $$I_{off} = M0 \times I_{BSILC} \tag{1}$$

is met.

Suppose when the number of SBD transistors among the number N of MOS transistors becomes M, the amount of off-state leakage current $I_{off}$ reaches the maximum amount of off-state leakage current $I_{offspec}$. Then, $$M = I_{offspec}/I_{BSILC} \tag{2}$$

is derived from Equation (1). It should be noted that M does not have to be a natural number in the following description.

In the present invention, a time it takes for the number of SBD transistors, among the number N of MOS transistors, to reach M is regarded as the circuit's lifetime $T_{BSILC}$.

Hereinafter, it will be described how to calculate the lifetime $T_{BSILC}$ using the SBD generation time $T_{SB}$ (see "Disclosure of Invention"). The SBD generation time $T_{SB}$ can be obtained by the B-SILC current measuring method shown in FIG. 3.

Figure 8:
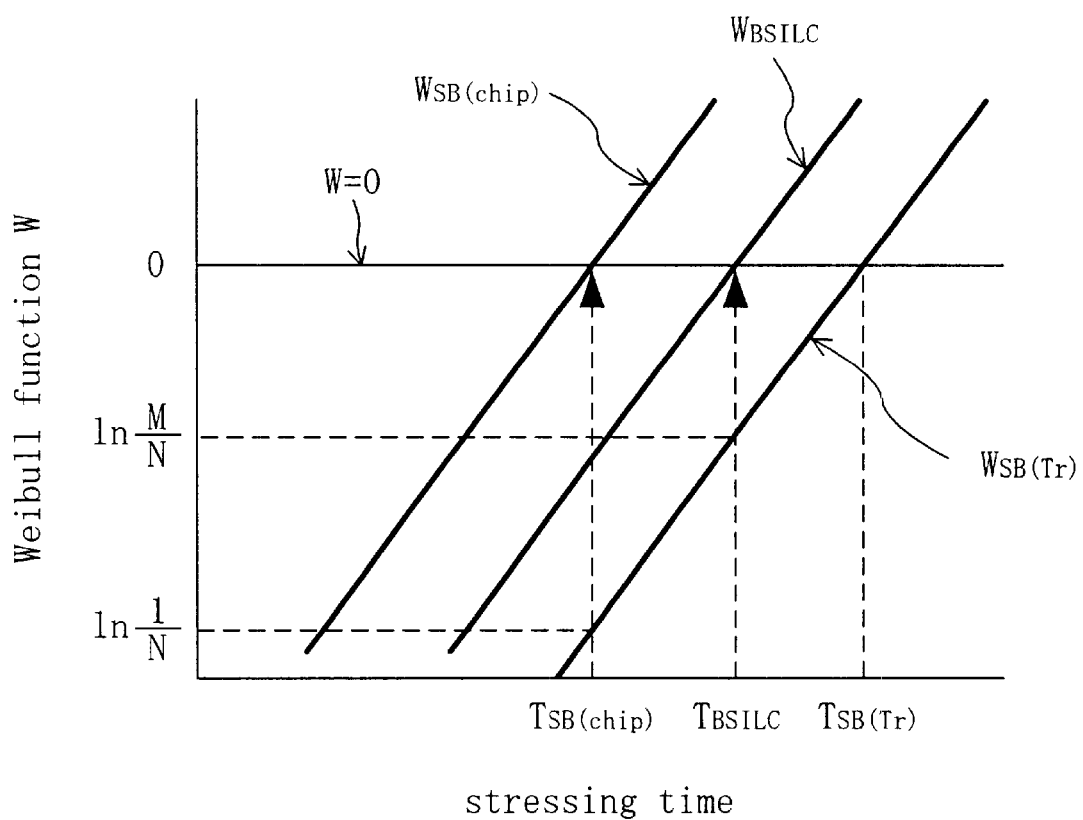
FIG. 8 is a graph illustrating Weibull plots for use in the inventive method of predicting the lifetime of a semiconductor integrated circuit.

FIG. 8 illustrates Weibull plots for use in the method of calculating the lifetime $T_{BSILC}$ using the SBD generation time $T_{SB}$. Weibull plots are normally used for statistically processing the generation of insulating film failures (e.g., dielectric breakdown or abnormal leakage current). In FIG. 8, the abscissa indicates a stressing time at log scales (which will be simply called a "time"), while the ordinate indicates the value of a Weibull function W.

In general, the Weibull function W can be given by $$W=\ln\{-\ln(1-F)\} \qquad (3)$$

where F is a cumulative percent failures.

Also, the cumulative percent failures F is the percentage of the "number of samples with breakdown" to the "total number of samples under test". The dependence of the cumulative percent failures F on the time t can be given by $$F(t)=1-\exp\{-(t/T)^m\} \qquad (4)$$

where m is a form parameter (i.e., Weibull slope) and T is a scale parameter (i.e., a time when the value of the Weibull function W given by Equation (3) becomes zero).

If the scale parameter of an MOS capacitor including a gate insulating film with an area $S_0$ is $T_0$, $$T(S)=T_0 \times (S_0/S)^{1/m} \qquad (5)$$

where T is the scale parameter of an MOS capacitor including a gate insulating film with an arbitrary area S (see T. Nigam et al., IRPS (1998) 62). That is to say, Equation (5) represents the area dependence of the scale parameter T. Accordingly, if the scale parameter $T_0$ of the capacitor including the gate insulating film with the area $S_0$ is known, the scale parameter T of the capacitor including the gate insulating film with the arbitrary area S can be obtained by Equation (5). That is to say, the time when the Weibull function W given by Equation (3) becomes zero can be obtained by Equation (5).

In FIG. 8, $W_{SB(Tr)}$ represents a Weibull function for a time it takes for an MOS capacitor under test, including a gate insulating film with the same area as that of the gate insulating film of one MOS transistor in the circuit, to cause the SBD. That is to say, $W_{SB(TR)}$ is a Weibull function for a time it takes for one MOS transistor in the circuit to cause the SBD. $W_{SB(chip)}$ represents a Weibull function for a time it takes for an MOS capacitor under test, including a gate insulating film with the same area as the total area of gate insulating films of all MOS transistors in the circuit, to cause the SBD. That is to say, $W_{SB(chip)}$ is a Weibull function for a time it takes for one of the number N of MOS transistors in the circuit to cause the SBD.

Also, in FIG. 8, the time $T_{SB(Tr)}$ when $W_{SB(Tr)}=0$ is a time when the cumulative percent failures F becomes 0.63 (i.e., a time when the SBD has occurred in 63% of the samples).

The difference between the Weibull functions $W_{SB(Tr)}$ and $W_{SB(chip)}$ results from the difference in area of the gate insulating film between corresponding MOS capacitors under test. In general, the Weibull functions W(S) and W($S_0$) of MOS capacitors including gate insulating films with areas S and $S_0$, respectively, meet the following relationship $$W(S)-W(S_0)=-\ln(S_0/S) \qquad (6)$$

(see T. Nigam et al., IRPS (1998) 62).

The gate insulating films of respective MOS transistors might have mutually different areas in a semiconductor integrated circuit. Even so, if there are a huge number of MOS transistors included, the area of the gate insulating film of each MOS transistor may be defined as the average or median area $S_{Tr}$ (e.g., 1 $\mu m^2$) of the gate insulating films of all the transistors. And the circuit may be regarded as virtually consisting of the number N of MOS transistors, each having a gate insulating film with the area $S_{Tr}$.

In that case, Equation (6) is modifiable into $$W_{SB(chip)}-W_{SB(tr)}=W(N\times S_{Tr})-W(S_{Tr})=-\ln(1/N) \qquad (7)$$

By using Equation (7), $W_{SB(chip)}$, representing the distribution of a time it takes for one of the number N of MOS transistors to cause the SBD, can be obtained from $W_{SB(Tr)}$ representing the distribution of a time it takes for one MOS transistor to cause the SBD.

Supposing $W_{BSILC}$ represents the distribution of a time it takes for the number M of MOS transistors, among the number N of transistors, to cause the SBD, $$W_{BSILC}-W_{SB(Tr)}=-\ln(M/N)=W((N/M)\times S_{Tr})-W(S_{Tr}) \qquad (8)$$

can be derived in the same way. Accordingly, $W_{BSILC}$ can be given by Equation (8).

Thus, if the Weibull function $W_{SB(Tr)}$ for a time it takes for one of MOS transistors in a semiconductor integrated circuit to cause the SBD is known, then a time it takes for the number M of MOS transistors, among the number N of transistors in the circuit, to cause the SBD, i.e., the circuit's lifetime $T_{BSILC}$ in the present invention, can be obtained for an arbitrary cumulative percent failures F. In the same way, by using the Weibull function $W_{SB(Tr)}$, the time $T_{SB(chip)}$ it takes for one of the number N of transistors in the circuit to cause the SBD can also be obtained for an arbitrary cumulative percent failures F.

Figure 1:
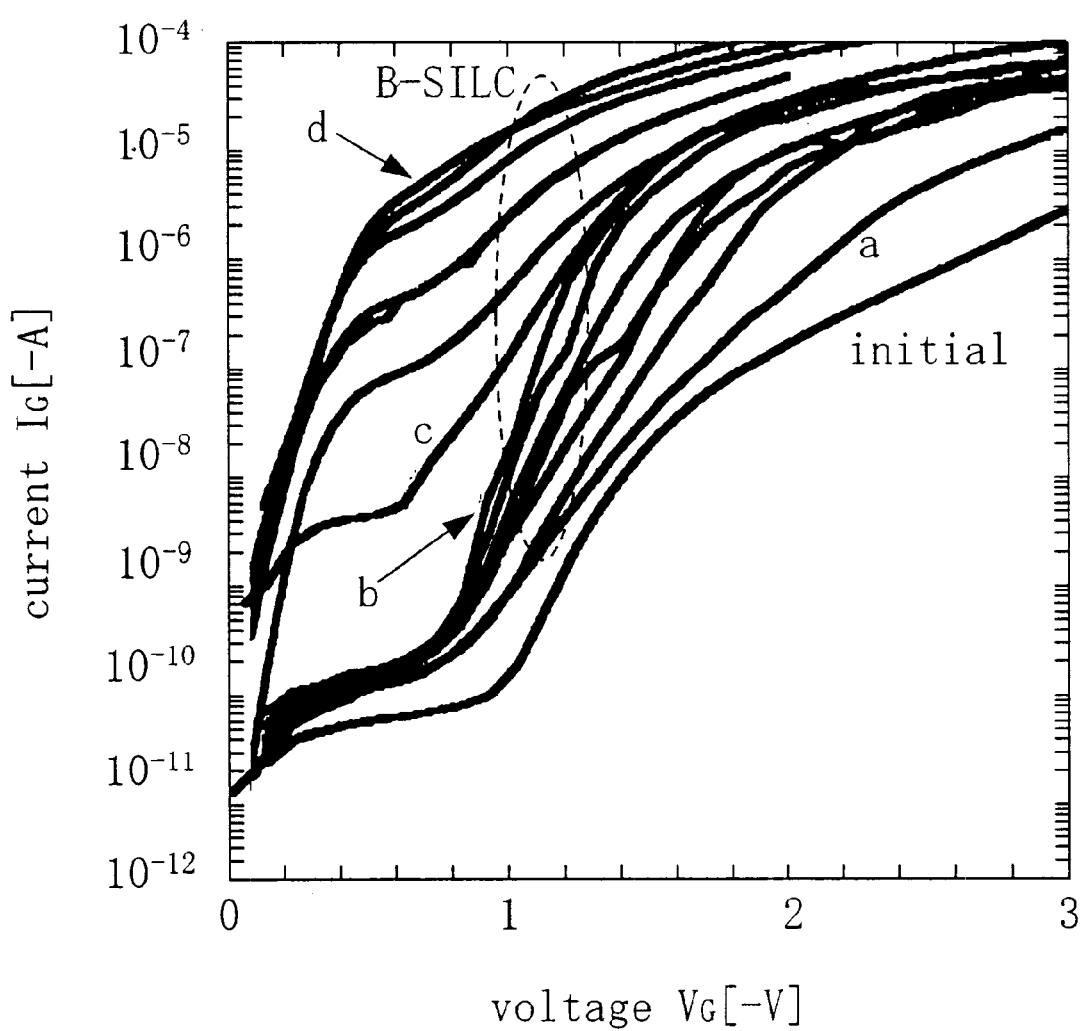
FIG. 1 is a graph illustrating variations of gate current-gate voltage characteristics obtained by repeatedly applying a constant voltage stress to an MOS capacitor including a gate insulating film with a thickness of 2.4 nm and an area of 0.01 mm².
Figure 2:
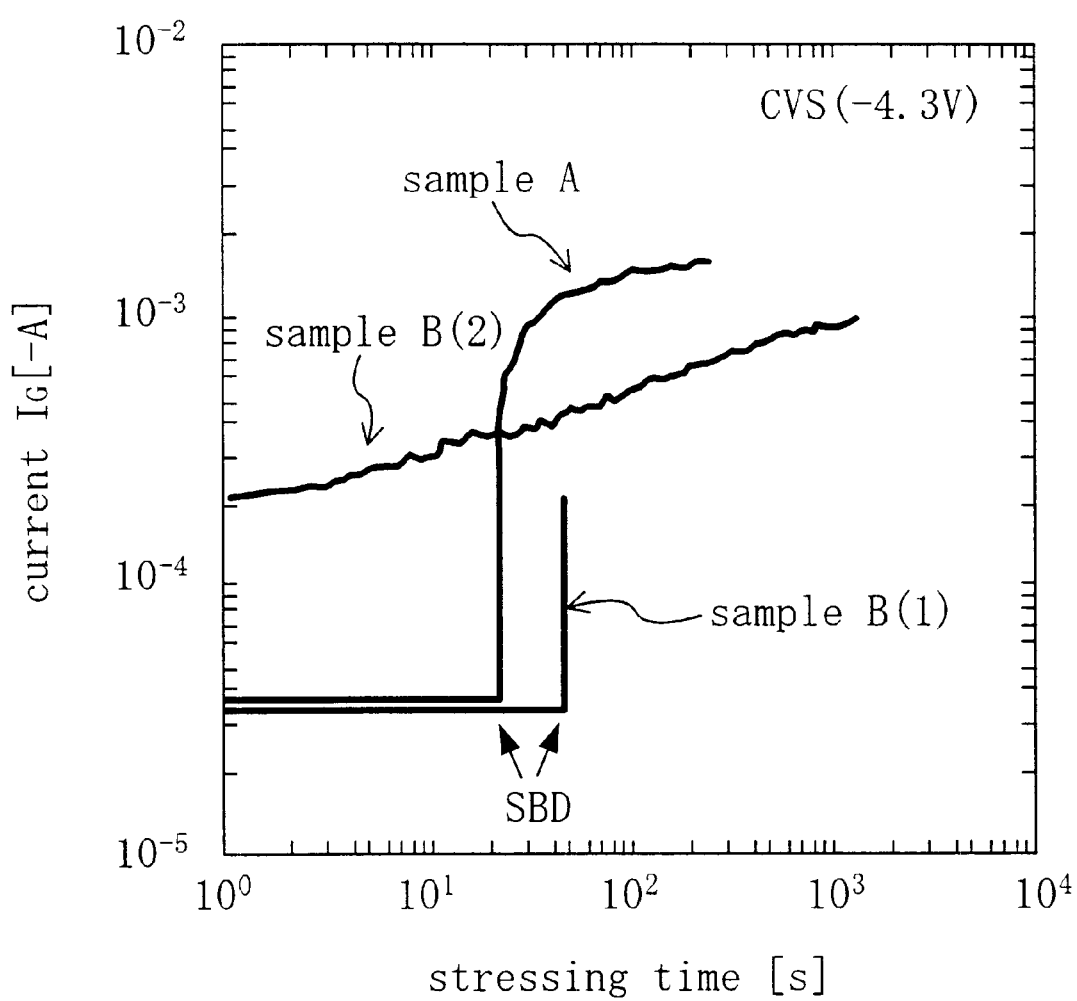
FIG. 2 is a graph illustrating relationships between the leakage current and stressing time where a constant voltage stress is applied to two MOS capacitors.
Figure 3:
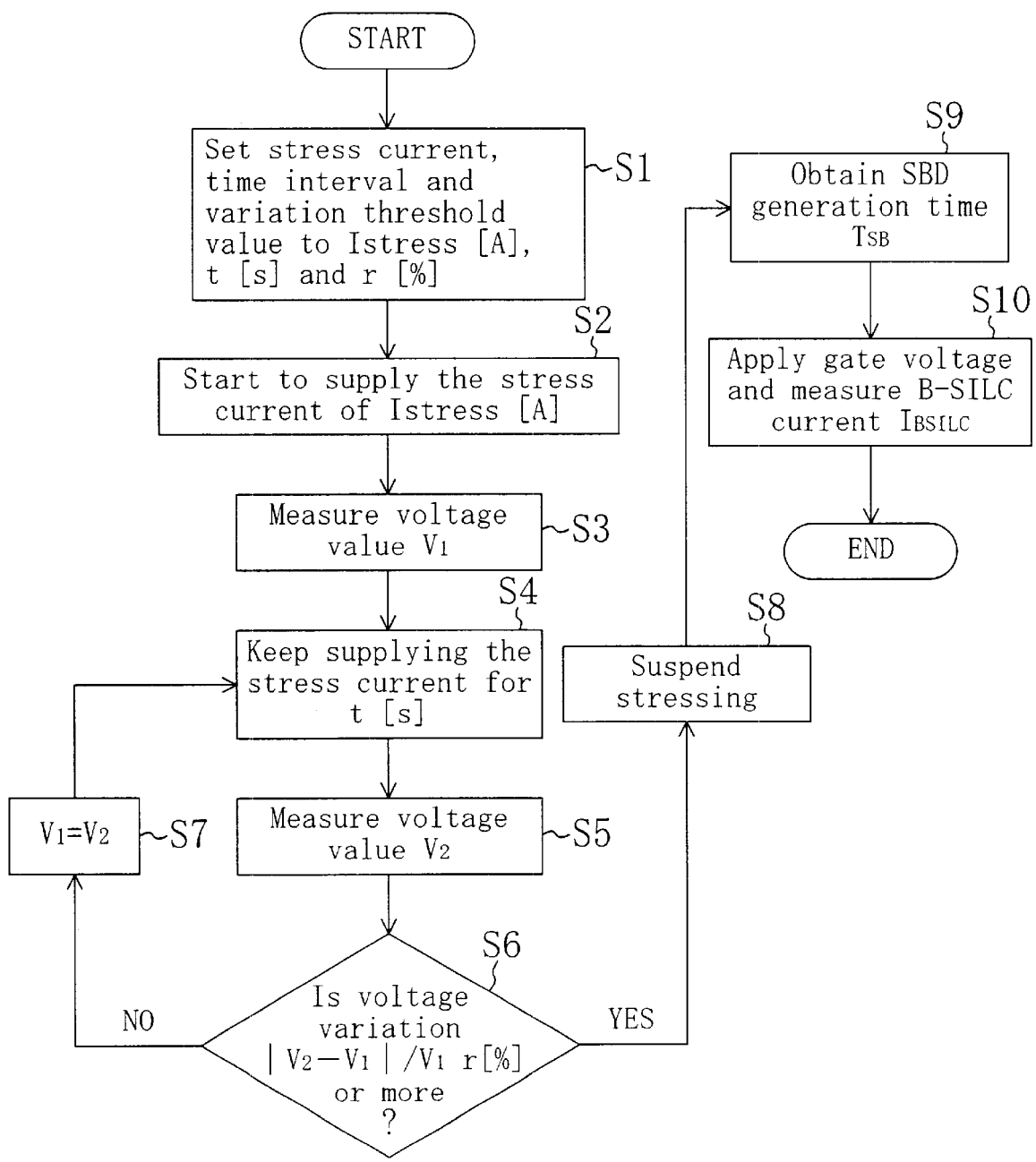
FIG. 3 is a flowchart illustrating a method of measuring a B-SILC current with a constant current stress placed.
Figure 4:
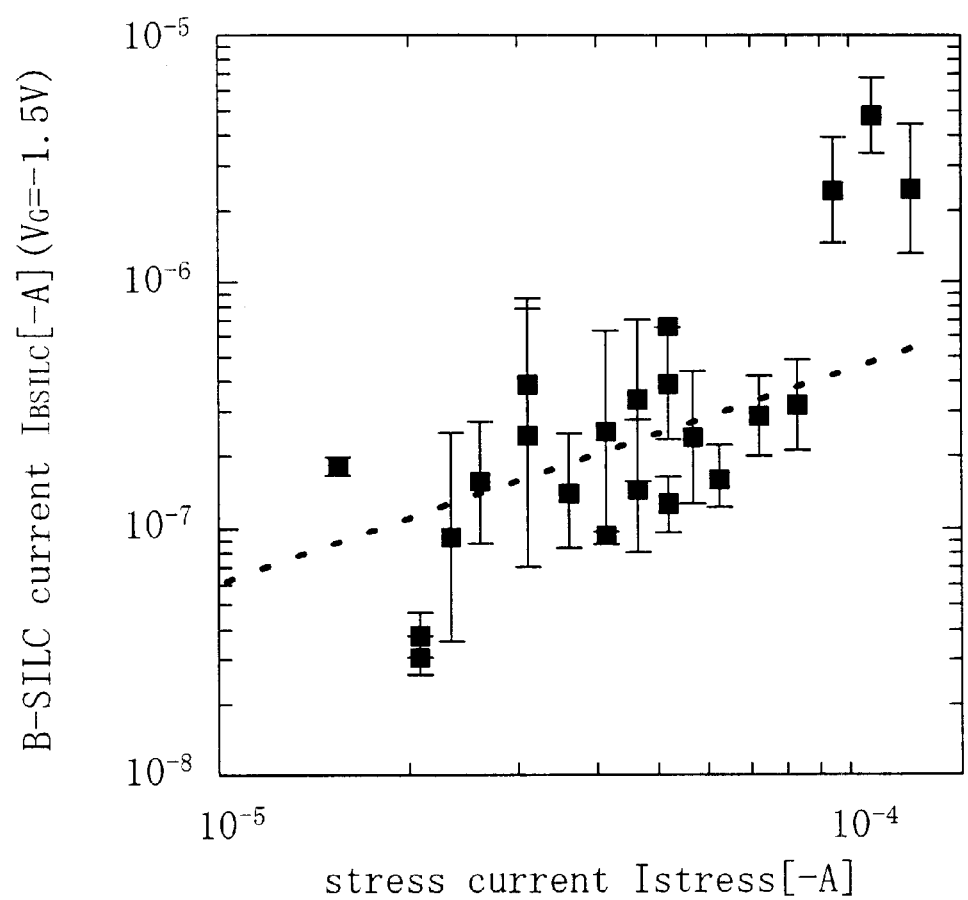
FIG. 4 is a graph illustrating a correlation between the amount of B-SILC current, which was obtained by the B-SILC current measuring method shown in FIG. 3, and the amount of stress current.
Figure 5:
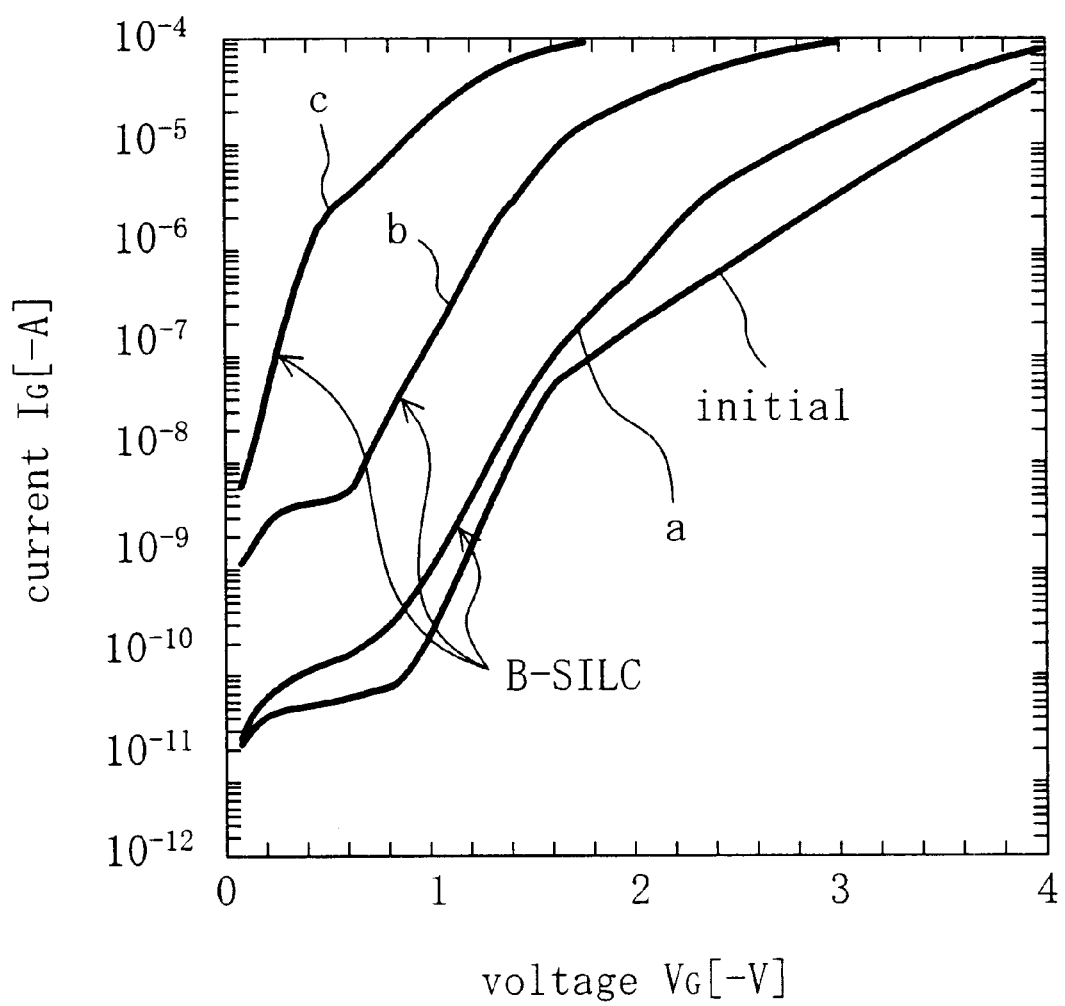
FIG. 5 is a graph illustrating variations of gate current-gate voltage characteristics obtained by the B-SILC current measuring method shown in FIG. 3.
Figure 6:
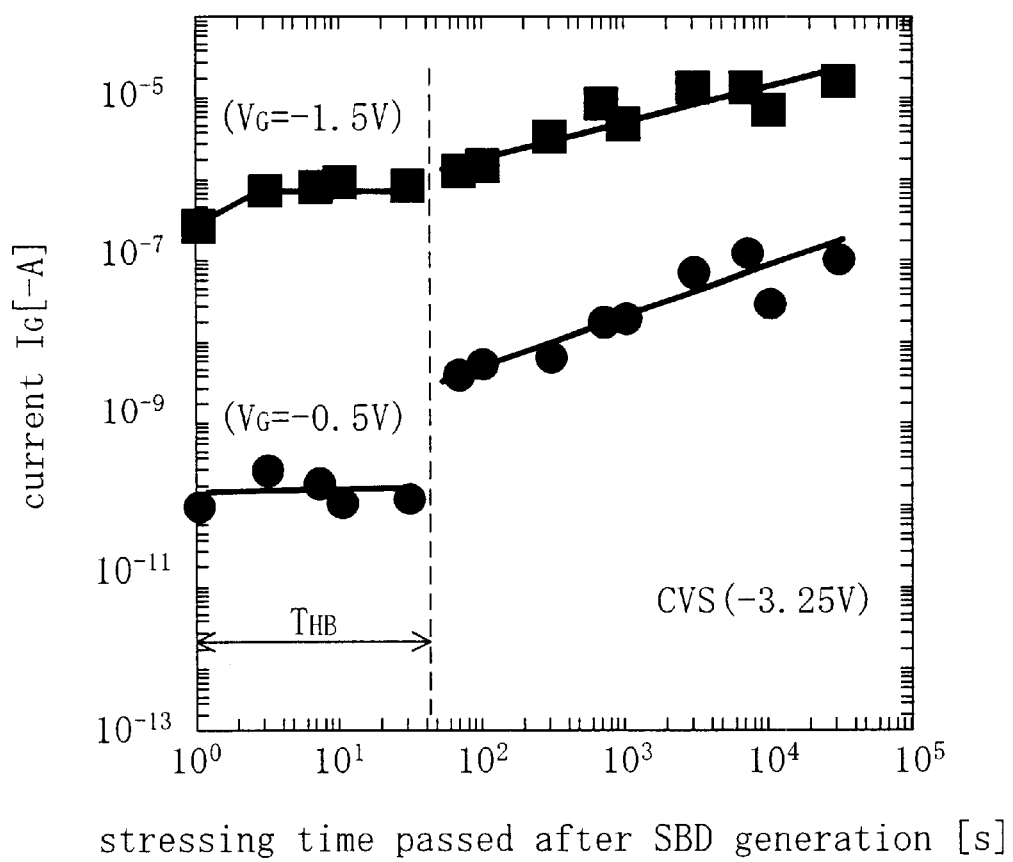
FIG. 6 is a graph illustrating relationships between the leakage current and stressing time passed after the SBD generation where a constant voltage stress of −3.25 V is applied to an MOS capacitor including a gate insulating film with a thickness of 2.4 nm and an area of 0.01 mm² after the SBD has occurred.
Figure 7:
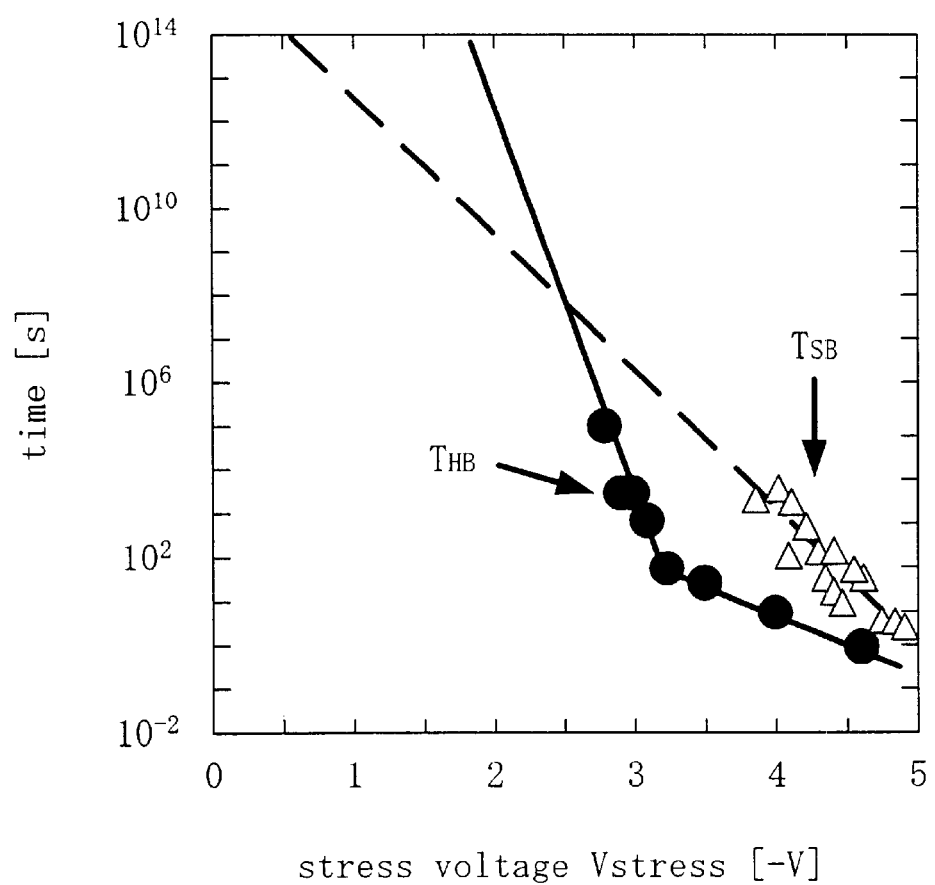
FIG. 7 is a graph illustrating the stress voltage dependence of the HBD and SBD generation times $T_{HB}$ and $T_{SB}$.

The Weibull function $W_{SB(Tr)}$ can also be obtained by measuring the SBD generation time $T_{SB}$ for an MOS capacitor under test, including a gate insulating film with the same area as the gate insulating film of one of the MOS transistors in the circuit, by the B-SILC current measuring method shown in FIG. 3, for example.

Hereinafter, it will be described how to obtain $T_{BSILC}$ and $T_{SB(chip)}$ constructively using the plot of the Weibull function $W_{SB(Tr)}$ shown in FIG. 8 for a cumulative percent failures F of 0.63 (i.e., when the Weibull function is zero). This method will be herein called a "constructive method".

First, a line, of which the Weibull function W becomes zero at the time when $W_{SB(Tr)}=\ln(1/N)$ and which is parallel to $W_{SB(Tr)}$, is drawn in accordance with Equation (7), thereby determining $W_{SB(chip)}$.

In the same way, a line, of which the Weibull function W becomes zero at the time when $W_{SB(Tr)}=\ln(M/N)$ and which is also parallel to $W_{SB(Tr)}$, is drawn in accordance with Equation (8), thereby determining $W_{BSILC}$.

Next, a line is drawn from the intersection between $W_{SB(chip)}$ and the line representing W=0 perpendicularly to the axis of abscissas, thereby obtaining $T_{SB(chip)}$.

In the same way, a line is drawn from the intersection between $W_{BSILC}$ and the line representing W=0 perpendicularly to the axis of abscissas, thereby obtaining $T_{BSILC}$.

Hereinafter, it will be described how to calculate $T_{BSILC}$ and $T_{SB(chip)}$ using the time $T_{SB(Tr)}$ obtained from the Weibull function $W_{SB(Tr)}$ (i.e., a time it takes for one of MOS transistors in a semiconductor integrated circuit to cause the SBD).

By using $T(S)/T_0=(S_0/S)^{1/m}$ (obtained by modifying Equation (5)) and Equations (7) and (8), $$T_{SB(chip)}/T_{SB(Tr)}=(S_{Tr}/(N\times S_{Tr}))^{1/m}=(1/N)^{1/m} \qquad (9)$$

and $$T_{BSILC}/T_{SB(Tr)}=(S_{Tr}/((N/M)\times S_{Tr}))^{1/m}=(M/N)^{1/m} \qquad (10)$$

are derived.

Also, from Equations (9) and (10), $$T_{BSILC}/T_{SB(chip)} = (M/N)^{1/m}/(1/N)^{1/m} = M^{1/m} \quad (11)$$

is derived.

Accordingly, after $T_{SB(Tr)}$ has been obtained from the Weibull function $W_{SB(Tr)}$, $T_{BSILC}$ can be calculated by using $T_{SB(Tr)}$ and Equation (10). Alternatively, after $T_{SB(chip)}$ has been obtained from the Weibull function $W_{SB(chip)}$, $T_{BSILC}$ can also be calculated by using $T_{SB(chip)}$ and Equation (11).

In the foregoing description, a semiconductor integrated circuit is supposed to virtually consist of a number N of MOS transistors each having a gate insulating film with an area $S_{Tr}$. On this supposition, a time it takes for an MOS capacitor under test, corresponding to one of those transistors, to cause the SBD is measured. And using this time measured, the circuit's lifetime $T_{BSILC}$, i.e., a time it takes for a number M of MOS transistors, among the number N of transistors, to cause the SBD, is obtained.

It should be noted that the probability of SBD generation in an MOS transistor is determined by the area of its gate insulating film as can be seen from Equation (7) or (8) or FIG. 8. Also, as described above (see the "third lifetime prediction approach"), one SBD spot can be regarded as equivalent to one SBD transistor in the present invention.

Accordingly, even if the gate insulating films of respective MOS transistors in a semiconductor integrated circuit have mutually different areas, at least the total area $S_{chip}$ of the gate insulating films of all the transistors in the circuit should be known. Then, the circuit's lifetime $T_{BSILC}$ can be predicted. Or, in this case, a time it takes before the number M of SBD spots are formed in the circuit can be derived by obtaining the time $T_0$ it takes for an MOS capacitor under test, including a gate insulating film with an arbitrary area $S_0$, to cause the SBD and then by using the time $T_0$ and the following Equation (12):

$$T_{BSILC} = T_0 \times ((M \times S_0)/S_{chip})^{1/m} \quad (12)$$

It is noted that Equation (12) is derived from $T_{BSILC} = T_{SB(chip)} \times M^{1/m}$, which is a modification to Equation (11), and from $T_{SB(chip)} = T_0 \times (S_0/S_{chip})^{1/m}$, which is obtained by substituting $T(S) = T_{SB(chip)}$ and $S = S_{chip}$ into Equation (5).

In the same way, even in the constructive method, only the total area $S_{chip}$ of the gate insulating films of all MOS transistors in a semiconductor integrated circuit should be known beforehand. Then, the circuit's lifetime $T_{BSILC}$ can be derived by obtaining the Weibull function $W_0$ for a time it takes for an MOS capacitor under test, including a gate insulating film with an arbitrary area $S_0$, to cause the SBD and by using the Weibull plot of the Weibull function $W_0$.

Embodiment 1

Hereinafter, a method of predicting the lifetime of a semiconductor integrated circuit according to a first embodiment of the present invention will be described as being applied to a semiconductor integrated circuit including 10 million MOS transistors, for example.

First, the B-SILC current measuring method shown in FIG. 3, for example, is applied to an MOS capacitor under test including a gate insulating film with an arbitrary area. In this manner, the magnitude of B-mode stress induced leakage current, flowing through each SBD spot in the circuit, is obtained as a unit leakage current level $I_{BSILC}$.

Next, a critical spot number M is obtained from the unit leakage current level $I_{BSILC}$. The critical spot number M is a minimum number of SBD spots required for a total leakage current (i.e., a total amount of B-mode stress induced leakage currents flowing through the 10 million MOS transistors) to exceed a predetermined reference level. In the first embodiment, a maximum amount of off-state leakage current $I_{offspec}$, determined by the power dissipation specification of the overall circuit, is used as the predetermined reference level.

For example, if the unit leakage current level $I_{BSILC}$ is 1 µA and the maximum amount of off-state leakage current $I_{offspec}$ is 1 mA, then the critical spot number M will be $I_{offspec}/I_{BSILC} = 1$ mA/1 µA=1,000 according to Equation (2). In this case, if an SBD spot has been formed in each of the 1,000 MOS transistors, for example, the total leakage current of the circuit exceeds the maximum amount of off-state leakage current $I_{offspec}$.

Thus, according to the first embodiment, a time it takes for the number of SBD spots in the circuit (i.e., among the 10 million MOS transistors) to reach the critical spot number (e.g., 1,000) is estimated as the circuit's lifetime $T_{BSILC}$.

More specifically, first, a time $T_0$ it takes for an MOS capacitor under test, including a gate insulating film with an arbitrary area $S_0$, to cause the SBD is obtained. Then, the circuit's lifetime $T_{BSILC}$ is predicted, for example, by Equation (12): $T_{BSILC} = T_0 \times ((M \times S_0)/S_{chip})^{1/m}$, where M is 1,000, $S_{chip}$ is the total area of the gate insulating films of the 10 million MOS transistors and m is a form parameter of the Weibull distribution of the time $T_0$.

Alternatively, the circuit's lifetime $T_{BSILC}$ may also be predicted by obtaining the Weibull function $W_0$ for the time it takes for the MOS capacitor under test including the gate insulating film with the arbitrary area $S_0$ to cause the SBD and then using the Weibull plot of the Weibull function $W_0$. See the constructive method described above.

Also, where the circuit virtually consists of the number N of MOS transistors, each having a gate insulating film with an area $S_{Tr}$, a time $T_{SB(Tr)}$ it takes for an MOS capacitor under test, including a gate insulating film with the area $S_{Tr}$, to cause the SBD is obtained first. Then, $T_{BSILC} = T_{SB(Tr)} \times (M/N)^{1/m}$, (which is a modification to Equation (10)) or $T_{BSILC} = T_{SB(Tr)} \times ((M \times S_{Tr})/S_{chip})^{1/m}$ (obtained by substituting $T_0 = T_{SB(Tr)}$ and $S_0 = S_{Tr}$ into Equation (12)) is used, thereby predicting the circuit's lifetime $T_{BSILC}$. In these equations, M is 1,000, N is 10 million, m is a form parameter of the Weibull distribution of the time $T_{SB(Tr)}$ and $S_{chip}$ is the total area of the gate insulating films of the 10 million MOS transistors.

Alternatively, the circuit's lifetime $T_{BSILC}$ may also be predicted by obtaining the Weibull function $W_{SB(Tr)}$ for the time it takes for an MOS capacitor under test, including a gate insulating film with the area $S_{Tr}$, to cause the SBD and then by using the Weibull plot of the Weibull function $W_{SB(Tr)}$. See the constructive method described above.

As described above, according to the first embodiment, the magnitude of B-mode stress induced leakage current, flowing through each SBD spot in multiple MOS transistors included in a semiconductor integrated circuit, is obtained as a unit leakage current level. Then, a critical spot number, which is a minimum number of SBD spots required for a total leakage current (i.e., a total amount of B-mode stress induced leakage currents flowing through those transistors) to exceed a predetermined reference level, is obtained from the unit leakage current level. And then a time it takes for the number of SBD spots formed in the MOS devices to reach the critical spot number is estimated as the circuit's lifetime. That is to say, according to the first embodiment, a time it takes for the total leakage current (i.e., the total amount of B-mode stress induced leakage currents flowing through the transistors in the circuit) to reach the predetermined reference level may be estimated as the circuit's lifetime.

Accordingly, the circuit's lifetime can be predicted without identifying the generation of a hard breakdown (HBD) in an MOS transistor. Thus, even if a thin gate insulating film, for which the HBD generation is non-identifiable, is used for the MOS transistor, the circuit's lifetime can be predicted reliably.

Also, compared to regarding a time it takes for just one of MOS transistors in a semiconductor integrated circuit to cause the SBD as the circuit's lifetime (i.e., the comparative example), the circuit's lifetime, expected by the first embodiment, can be closer to the actual one. Specifically, where the circuit is made up of 10 million MOS transistors, the circuit's lifetime predicted by the comparative example is about 1,000 seconds, while the circuit's lifetime predicted by the first embodiment is about $10^7$ seconds. Accordingly, if the thickness of a gate insulating film or a gate voltage for the MOS transistors is adjusted to equalize the circuit's lifetime, predicted by the first embodiment, with a desired value (e.g., 10 years), the film will not thicken excessively or the voltage will not decrease unnecessarily. As a result, the circuit can be downsized. In addition, the operating speed of the MOS transistors can be increased, thus enhancing the performance of the circuit.

In the first embodiment, 10 million MOS transistors are used as exemplary MOS devices included in a semiconductor integrated circuit. However, the type and number of MOS devices included in the circuit are not particularly limited.

Also, in the first embodiment, an MOS capacitor under test is used as an exemplary MOS device under test. However, the MOS device under test is not limited to a particular type.

Furthermore, in the first embodiment, the maximum amount of off-state leakage current, determined by the power dissipation specification of the overall circuit, is used as an exemplary predetermined reference level. Alternatively, a maximum amount of off-state leakage current, determined by the performance specification of the circuit, for example, may also be used instead.

Embodiment 2

Hereinafter, a method for reliability testing of a semiconductor integrated circuit according to a second embodiment of the present invention will be described. Specifically, the method of the second embodiment is a method for testing the reliability of a semiconductor integrated circuit, including MOS devices like MOS transistors, using the circuit's lifetime predicted by the lifetime prediction method of the first embodiment.

As in the first embodiment, suppose a time it takes for a total leakage current (i.e., a total amount of B-mode stress induced leakage currents) flowing through respective MOS devices in a semiconductor integrated circuit to reach a predetermined reference level is defined as the circuit's lifetime $T_{BSILC}$ at a voltage required for operating the circuit, i.e., at an actual operating voltage. The design or fabrication process of the circuit is supposed to be determined so as to equalize the circuit's lifetime $T_{BSILC}$ with a desired value (e.g., 10 years). And also suppose that semiconductor integrated circuits are actually mass-produced under these conditions.

In general, while a semiconductor integrated circuit is still being developed, strict lifetime evaluation (or lifetime prediction) is performed. On the other hand, while the circuits are being manufactured, routine reliability test or failure diagnosis is carried out on the circuits using simple and convenient control indices (or specifications).

In the routine reliability test on a semiconductor integrated circuit, an MOS device under test (e.g., MOS capacitor or transistor), included in a sample semiconductor integrated circuit that was fabricated along with, or separately from, the circuit to be a product, is used.

An exemplary parameter used as the specification (which will be herein called a "control point") may be a time $T_{BD}$ it should take before a dielectric breakdown occurs where a constant current or voltage stress is placed on the gate insulating film of an MOS device under test. This time will be herein called a "dielectric breakdown time". Or a total quantity $Q_{BD}$ of electrons that have been injected into the gate insulating film before the dielectric breakdown occurs (which quantity will be herein called a "dielectric breakdown charge quantity") may also be used as another parameter.

Hereinafter, a method for reliability testing of a semiconductor integrated circuit according to the second embodiment will be described in detail as being applied to a (routine) test conducted to see if semiconductor integrated circuits mass-produced were actually manufactured to have the lifetime $T_{BSILC}$. The dielectric breakdown time $T_{BD}$, a control point for the second embodiment, is a time $T_{SB}$ it takes for an MOS device under test to cause an SBD where a constant current or voltage stress is placed on the gate insulating film thereof. The time $T_{SB}$ will be herein called an "SBD generation time". The dielectric breakdown charge quantity $Q_{BD}$, another control point for the second embodiment, is a total quantity $Q_{SB}$ of electrons injected into the gate insulating film of an MOS device under test before the SBD occurs where a constant current or voltage stress is placed on the gate insulating film. The quantity $Q_{SB}$ will be herein called an "SBD generation charge quantity".

First, a first time T1 it takes for a total leakage current (i.e., a total amount of B-mode stress induced leakage currents) flowing through respective MOS devices in a semiconductor integrated circuit to reach a predetermined reference level is obtained where an actual operating voltage is being applied thereto. That is to say, the circuit's lifetime $T_{BSILC}$ at the actual operating voltage is predicted.

Figure 9:
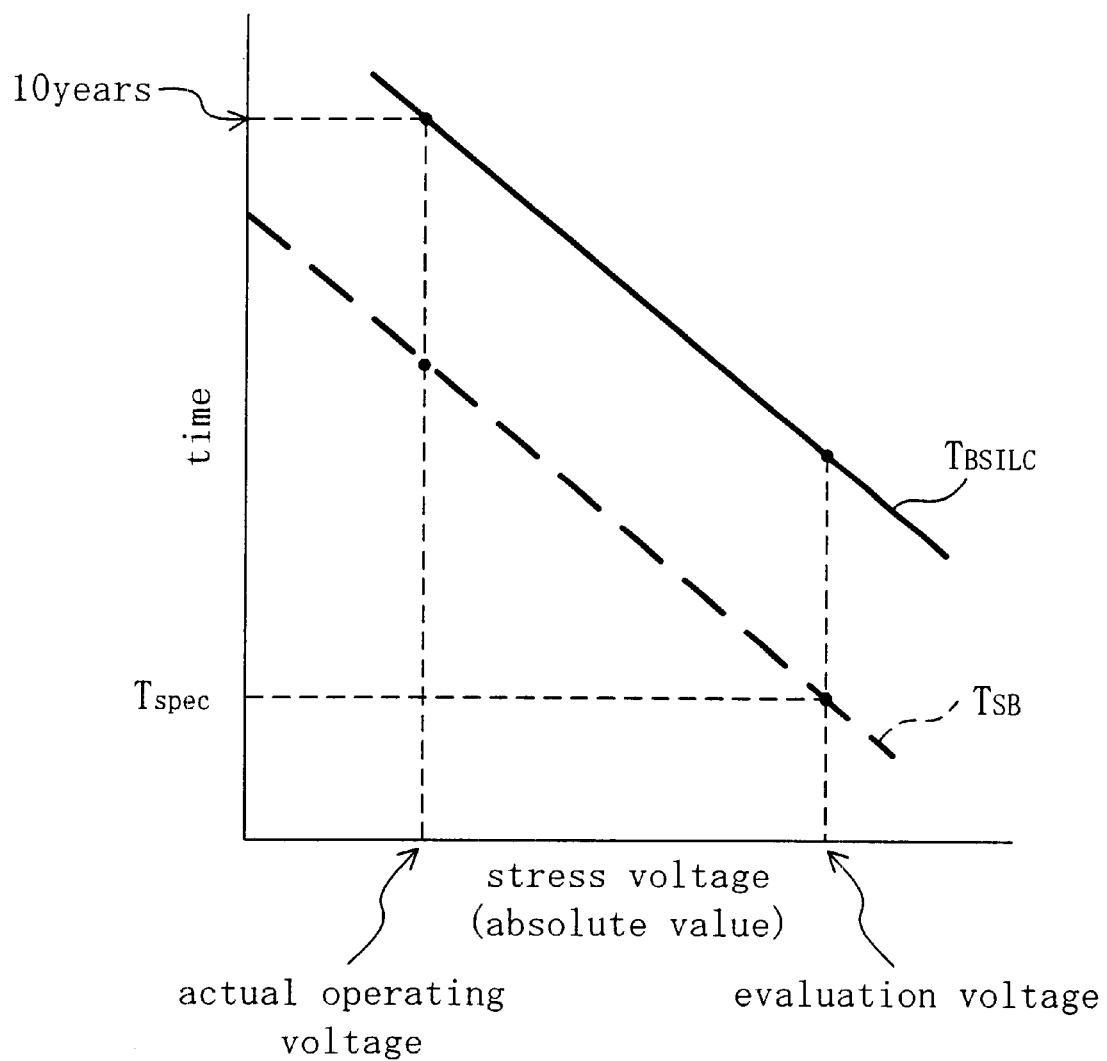
FIG. 9 is a graph illustrating the stress voltage dependence of the lifetime $T_{BSILC}$ and SBD generation time $T_{SB}$ for use in a method for reliability testing of a semiconductor integrated circuit according to a second embodiment of the present invention.

Next, a second time T2 it takes for an MOS device under test to cause a soft breakdown is estimated from the first time T1 where a test voltage higher than the actual operating voltage is being applied thereto. The test voltage will be herein called an "evaluation voltage". That is to say, the SBD generation time $T_{SB}$ at the evaluation voltage is estimated. Thereafter, a reference control level is determined for a predetermined control point of the MOS device under test by the second time T2.

Where the SBD generation time $T_{SB}$ is used as the control point, a reference control level $T_{spec}$ may be determined for the SBD generation time $T_{SB}$ by using the stress voltage dependence of the lifetime $T_{BSILC}$ and SBD generation time $T_{SB}$ as shown in FIG. 9, for example.

Specifically, as shown in FIG. 9, an SBD generation time $T_{SB}$, corresponding to a point where the circuit's lifetime $T_{BSILC}$ at the actual operating voltage, i.e., the first time T1, is 10 years, for example, is obtained. Then, another SBD generation time $T_{SB}$ at the evaluation voltage, i.e., the second time T2, is obtained by reference to the stress voltage dependence of the SBD generation time $T_{SB}$. And the second time T2 is defined as the reference control level $T_{spec}$ (e.g., 1,000 seconds).

It should be noted that if an evaluation voltage, higher than the actual operating voltage (e.g., about −1.5 V), is applied to the MOS device under test, then HBD or redefined HBD (see "Disclosure of Invention") might occur at the SBD generation time $T_{SB}$ at the evaluation voltage. Even so, according to this embodiment, the interval between the time the evaluation voltage started to be applied and the time the HBD or redefined HBD occurs is regarded as the SBD generation time $T_{SB}$.

Also, where the SBD generation charge quantity $Q_{SB}$ is used as the control point, a reference control level $Q_{spec}$ (e.g., 1 C/cm) may be determined for the SBD generation charge quantity $Q_{SB}$ by the second time T2.

Next, the control point (i.e., the SBD generation time $T_{SB}$ or charge quantity $Q_{SB}$) of the MOS device under test at the evaluation voltage is actually measured, and then it is determined whether or not a result of the measurement meets the reference control level $T_{spec}$ or $Q_{spec}$. In this manner, the reliability of the circuit can be tested routinely. The control point of the device under test is measured at an evaluation voltage higher than the actual operating voltage. Thus, as shown in FIG. 9, it can be determined in a short time whether the real lifetime of the circuit under test is longer or shorter than the expected lifetime $T_{BSILC}$.

As described above, according to the second embodiment, 20 the reliability of a semiconductor integrated circuit can be tested using the first time T1, i.e., the circuit's lifetime $T_{BSILC}$ predicted by the lifetime prediction method of the first embodiment at the actual operating voltage. Thus, even if a thin gate insulating film, for which the HBD generation is non-identifiable, is used for its MOS devices, the reliability of the circuit still can be tested accurately enough.

In the second embodiment, a reference control level is determined by the circuit's lifetime $T_{BSILC}$ (i.e., the first time T1) predicted by the lifetime prediction method of the first embodiment at the actual operating voltage. Alternatively, a reference control level may be determined in view of the shape or size of an MOS device under test or the conditions (e.g., temperature, voltage or current) under which the control point was measured. Or the reference control level may also be determined by the control point actually measured for a real fabricated semiconductor integrated circuit or a device under test. Next, another reference control level may be determined by the first time T1. And then it may be determined according to the latter reference control level whether or not the former reference control level is appropriate.

Also, in the second embodiment, the type and number of MOS devices included in a semiconductor integrated circuit are not particularly limited.

Furthermore, in the second embodiment, the control point is not limited to a particular one, either.

What is claimed is:

1. A method of predicting the lifetime of a semiconductor integrated circuit, characterized by comprising:

a first step of deriving, as a unit leakage current level, the amount of a B-mode stress induced leakage current flowing through each of SBD spots where a soft breakdown has occurred in multiple MOS devices included in the circuit;

a second step of obtaining a critical spot number from the unit leakage current level, the critical spot number being a minimum number of SBD spots required for a total amount of B-mode stress induced leakage currents, flowing through the respective MOS devices, to exceed a predetermined reference level; and a third step of estimating, as an expected lifetime of the circuit, a time it takes for the number of SBD spots in the MOS devices to reach the critical spot number.

2. The method of claim 1, characterized in that the third step comprises the steps of:

obtaining a time $T_0$ it takes for an MOS device under test, including a gate insulating film with an area $S_0$, to cause a soft breakdown; and predicting the circuit's lifetime by $$T_{BSILC} = T_0 \times ((M \times S_0)/S_{chip})^{1/m}$$

where $T_{BSILC}$ is the circuit's lifetime, M is the critical spot number, $S_{chip}$ is a total area of the gate insulating films of the MOS devices and m is a form parameter in a Weibull distribution of the time $T_0$.

3. The method of claim 1, characterized in that the circuit is virtually made up of a number N (which is a natural number) of MOS devices, each having a gate insulating film with an area $S_{Tr}$, and that the third step comprises the steps of:

obtaining a time $T_{SB(Tr)}$ it takes for an MOS device under test, including a gate insulating film with the area $S_{Tr}$, to cause a soft breakdown; and predicting the circuit's lifetime by $$T_{BSILC} = T_{SB(Tr)} \times (M/N)^{1/m}$$

where $T_{BSILC}$ is the circuit's lifetime, M is the critical spot number and m is a form parameter in a Weibull distribution of the time $T_{SB(Tr)}$.

4. The method of claim 1, characterized in that the circuit is virtually made up of a number N (which is a natural number) of MOS devices, each having a gate insulating film with an area $S_{Tr}$, and that the third step comprises the steps of:

obtaining a time $T_{SB(Tr)}$ it takes for an MOS device under test, including a gate insulating film with the area $S_{Tr}$, to cause a soft breakdown; and predicting the circuit's lifetime by $$T_{BSILC} = T_{SB(Tr)} \times ((M \times S_{Tr})/S_{chip})^{1/m}$$

where $T_{BSILC}$ is the circuit's lifetime, M is the critical spot number, $S_{chip}$ is a total area of the gate insulating films of the MOS devices and m is a form parameter in a Weibull distribution of the time $T_{SB(Tr)}$.

5. The method of claim 1, characterized in that the third step comprises the steps of:

deriving a Weibull function for a time it takes for an MOS device under test to cause a soft breakdown; and predicting the circuit's lifetime using a Weibull plot of the Weibull function.

6. A method for reliability testing of a semiconductor integrated circuit, characterized by comprising:

a first step of estimating a first time it takes for a total amount of B-mode stress induced leakage currents, flowing through respective MOS devices in the circuit, to reach a predetermined reference level where an actual operating voltage is applied to the circuit;

a second step of estimating a second time it takes for an MOS device under test to cause a soft breakdown from the first time where a test voltage, higher than the actual operating voltage, is applied thereto, and then determining, by the second time, a reference control level for a predetermined control point of the device under test; and a third step of measuring the control point of the device under test where the test voltage is applied thereto, and then determining whether or not a result of the measurement meets the reference control level.

7. A method of predicting the lifetime of a semiconductor integrated circuit, characterized by estimating, as an expected lifetime of the circuit, a time it takes for a total amount of B-mode stress induced leakage currents, flowing through respective MOS devices in the circuit, to reach a predetermined reference level.

* * * * *